US009190141B2

(12) United States Patent
Chai et al.

(10) Patent No.: US 9,190,141 B2
(45) Date of Patent: Nov. 17, 2015

(54) CIRCUITS FOR VOLTAGE OR CURRENT BIASING STATIC RANDOM ACCESS MEMORY (SRAM) BITCELLS DURING SRAM RESET OPERATIONS, AND RELATED SYSTEMS AND METHODS

(71) Applicant: QUALCOMM Incorporated, San Diego, CA (US)

(72) Inventors: Chiaming Chai, Cary, NC (US); Satendra Kumar Maurya, Raleigh, NC (US)

(73) Assignee: QUALCOMM Incorporated, San Diego, CA (US)

( * ) Notice: Subject to any disclaimer, the term of this patent is extended or adjusted under 35 U.S.C. 154(b) by 83 days.

(21) Appl. No.: 14/064,297

(22) Filed: Oct. 28, 2013

(65) Prior Publication Data

US 2015/0036418 A1     Feb. 5, 2015

Related U.S. Application Data

(60) Provisional application No. 61/859,998, filed on Jul. 30, 2013.

(51) Int. Cl.
| | | |
|---|---|---|
| *G11C 11/00* | (2006.01) | |
| *G11C 11/412* | (2006.01) | |
| *G11C 7/20* | (2006.01) | |
| *G11C 11/417* | (2006.01) | |
| *G11C 11/419* | (2006.01) | |

(52) U.S. Cl.
CPC ............... *G11C 11/412* (2013.01); *G11C 7/20* (2013.01); *G11C 11/417* (2013.01); *G11C 11/419* (2013.01)

(58) Field of Classification Search
CPC ............ G06F 12/0893; G06F 12/0802; G06F 1/3275; G06F 12/0895; G06F 1/3203; G06F 8/4432; G06F 17/5045; G11C 15/04

USPC ............. 365/154, 174, 188, 189.011, 189.16, 365/226, 227, 229

See application file for complete search history.

(56) References Cited

U.S. PATENT DOCUMENTS

| | | |
|---|---|---|
| 4,982,365 A | 1/1991 | Ohtani et al. |
| 5,018,102 A | 5/1991 | Houston |
| 5,559,747 A | 9/1996 | Kasamizugami et al. |

(Continued)

OTHER PUBLICATIONS

Invitation to Pay Additional Fees and Partial International Search for PCT/US2014/048573, mailed Feb. 18, 2015, 6 pages.

(Continued)

*Primary Examiner* — Fernando Hidalgo
(74) *Attorney, Agent, or Firm* — Withrow & Terranova, PLLC

(57) ABSTRACT

Circuits for voltage or current biasing static random access memory (SRAM) bitcells during SRAM reset operations are disclosed. Related systems and methods are also disclosed. To reset a plurality of SRAM bitcells in a single reset operation, a biasing circuit is provided and coupled to the plurality of SRAM bitcells. The biasing circuit is configured to apply a voltage or current bias to the SRAM bitcells during a reset operation after power provided to the SRAM bitcells is collapsed to a collapsed power level below an operational power level. The bias is applied as the power to the SRAM bitcells is restored to an operational power level, thus forcing the SRAM bitcells into a desired state. In this manner, the SRAM bitcells can be reset in a single reset operation without need for an increased drive strength from a reset circuit and without need to provide specialized SRAM bitcells.

27 Claims, 8 Drawing Sheets

(56) References Cited

U.S. PATENT DOCUMENTS

| | | |
|---|---|---|
| 7,016,251 B2 | 3/2006 | Gabric et al. |
| 7,333,380 B2 | 2/2008 | Schoellkopf |
| 7,358,764 B1 | 4/2008 | Chan et al. |
| 8,111,535 B2 | 2/2012 | Akyildiz et al. |
| 8,411,491 B1 | 4/2013 | Liu et al. |
| 2006/0149857 A1* | 7/2006 | Holman .......................... 710/3 |
| 2006/0285400 A1 | 12/2006 | Ohbayashi |
| 2008/0151654 A1 | 6/2008 | Allan et al. |
| 2013/0051139 A1 | 2/2013 | Dodge et al. |
| 2013/0094307 A1* | 4/2013 | Cheng et al. .................. 365/191 |
| 2013/0238856 A1* | 9/2013 | Loh et al. ...................... 711/118 |
| 2014/0328112 A1* | 11/2014 | Riley ............................ 365/154 |

OTHER PUBLICATIONS

International Search Report and Written Opinion for PCT/US2014/048573, mailed Jun. 19, 2015, 19 pages.

* cited by examiner

CIRCUITS FOR VOLTAGE OR CURRENT BIASING STATIC RANDOM ACCESS MEMORY (SRAM) BITCELLS DURING SRAM RESET OPERATIONS, AND RELATED SYSTEMS AND METHODS

PRIORITY CLAIM

The present application claims priority to U.S. Provisional Patent Application Ser. No. 61/859,998 filed on Jul. 30, 2013 and entitled "CIRCUITS FOR BIASING STATIC RANDOM ACCESS MEMORY (SRAM) BITCELLS DURING SRAM RESET OPERATIONS, AND RELATED SYSTEMS AND METHODS," which is incorporated herein by reference in its entirety.

BACKGROUND

I. Field of the Disclosure

The technology of the disclosure relates to static random access memory (SRAM) bitcells and resetting of SRAM bitcells.

II. Background

A memory cell is a basic building block of computer data storage, also known as "memory." A computer system may either read data from or write data to memory. There are different types of memory. For example, one type of memory is static random access memory (SRAM). As an example, SRAM may be used as cache memory in a central processing unit (CPU) system. A SRAM cache memory may be comprised of a tag array and a data array. The tag array receives a memory address as part of a memory access request from a CPU. A portion of the memory address is stored as a tag in the tag array and a remaining portion of the memory address is used to index a location. Each tag entry has one or more corresponding entries in the data array. The entries in the tag array can be valid or invalid.

A tag will be valid if the data stored in the data entry in the data array of the SRAM cache memory corresponding to the tag is valid. In the case of a valid tag, the data for the memory access request can be directly accessed from the data array in the SRAM cache memory as opposed to being accessed from a higher level memory. If a tag accessed as part of a memory access request is invalid, the data stored in the data entry of the data array of the SRAM cache memory corresponding to the tag is deemed invalid. For example, the data in the data array corresponding to the invalid tag may not be updated to be coherent with the data stored at the memory address of the memory access request in higher memory. To indicate whether a tag in a SRAM cache memory is valid or invalid, a valid bit can be provided in the SRAM cache memory. The valid bit can be comprised of a single SRAM bitcell. A plurality of valid bits can be provided over a column of the SRAM cache memory, with each valid bit corresponding to a row in the SRAM cache memory. The value or state of a valid bit can be set to a logical high ("1") to indicate that the tag is valid, and to a logical low ("0") to indicate the tag is invalid, or vice versa. A cache miss is generated by the SRAM cache memory when the valid bit corresponding to the memory address of the memory access request is invalid in the tag array to prevent invalid data in the data array from being used to fulfill the memory access request.

During operation of a device containing SRAM cache memory, the valid bits in the SRAM cache memory will power up in a random, unknown state (i.e., an unknown charge level) of either logical one ("1") or logical zero ("0"). Since the valid bits will power up in a random, unknown state, it may be desired to perform an invalidate operation to set or reset all of the valid bits in the tag array of the SRAM cache memory to an invalid state. In this manner, if the SRAM cache memory is accessed before being filled with valid data, the valid bits being set to an invalid state will cause a cache miss to occur.

One method of invalidating valid bits of SRAM cache memory involves individually resetting the state of each valid bit to an invalid state. However, this method of individually resetting the validity state of each of the valid bits is time consuming. Another method of resetting the valid state of an entire column of valid bits in an SRAM cache memory in a single reset operation involves providing the valid bits as specialized SRAM bitcells. The specialized SRAM bitcells include one or more additional transistors. Each of the additional transistors in the specialized SRAM bitcells is coupled to a voltage rail node and/or a ground rail node. Thus, an entire column of the specialized SRAM bitcells may be reset in a single reset operation by activating all of the additional transistors for each of the specialized SRAM bitcells to be coupled to the voltage rail node and/or the ground rail node to force the values of the specialized SRAM bitcells to an invalid state. However, providing the additional transistors for the valid bits increases the SRAM cache memory density. Specialized SRAM bitcells with additional transistors for an invalidate operation require a more complicated manufacturing process because of the smaller SRAM geometries.

One way to avoid the need to provide specialized SRAM bitcells while maintaining the ability to provide a single reset operation for valid bits in a SRAM cache memory is to provide a reset circuit having increased drive strength. The reset circuit may be the validity bitline driver that drives a bitline to a plurality of SRAM bitcells, such as a column of SRAM bitcells. The increased drive strength provides the additional current capacity for the validity bitline driver to be capable of forcing the load of an entire column of the valid bits in the SRAM cache memory to an invalid state in a single reset operation. However, providing additional drive strength in a validity bitline driver may increase the size of the validity bitline driver in the SRAM cache memory, thus increasing the size of the memory.

It is desired to provide for the capability of a single reset operation to reset a plurality of valid bits in the SRAM cache memory without the need to provide specialized SRAM bitcells or an increased drive strength validity bitline driver, each of which increase SRAM cache memory density.

SUMMARY OF THE DISCLOSURE

Embodiments disclosed in the detailed description include circuits for voltage or current biasing static random access memory (SRAM) bitcells during SRAM reset operations. Related systems and methods are also disclosed. As one non-limiting example, the SRAM bitcells are included in an SRAM cache memory provided in a central processing unit (CPU) system. It may be desired to reset a plurality of SRAM bitcells to a desired state in a single reset operation, as opposed to a more time consuming method of resetting the state of each SRAM bitcell individually. For example, it may be desired to perform a reset invalidate operation for invalidating a plurality of SRAM bitcells used as valid bits in a cache memory efficiently in a single reset operation.

In this regard, in embodiments disclosed herein, to reset a plurality of SRAM bitcells in a single reset operation, a biasing circuit is provided and coupled to a plurality of SRAM bitcells. The biasing circuit is configured to apply a voltage or current bias to each of the plurality of SRAM bitcells during the single reset operation after power provided to the SRAM bitcells is collapsed to a collapsed power level below an operational power level of the SRAM bitcells. Collapsing power to the SRAM bitcells collapses the voltage in SRAM bitcells, allowing the write operation to more easily occur. The voltage or current bias is applied by the biasing circuit to the SRAM bitcells as power to the SRAM bitcells is restored to an operational power level, thus forcing the SRAM bitcells into a desired state. Collapsing the power provided to the SRAM bitcells allows the biasing circuit to force a state in the plurality of SRAM bitcells with less drive strength than would otherwise be required if power provided to the SRAM bitcells was not collapsed and the biasing circuit had to overcome the voltage stored in the SRAM bitcells when an operational power is provided to the SRAM bitcells. In this manner, a plurality of SRAM bitcells can be reset in a single reset operation without having to increase the drive strength of a reset circuit configured to reset the state of the SRAM bitcells. Even with increased drive strength, it may not always be enough to correctly reset the SRAM bitcells to a desired state. Further, the biasing circuit provided herein can also avoid the need to provide specialized SRAM bitcells to allow for resetting of a plurality of SRAM bitcells in a single reset operation, where each specialized SRAM bitcell includes one or more additional transistors capable of forcing the SRAM bitcells to a desired state.

In this regard, in one embodiment, a data entry valid circuit for performing a reset operation on a plurality of SRAM bitcells in a SRAM is provided. The data entry valid circuit comprises a power collapsing circuit. The power collapsing circuit is configured to collapse power supplied by a power supply to a plurality of SRAM bitcells in a SRAM from an operational power level to a collapsed power level lower than the operational power level in response to receiving a reset input. The data entry valid circuit further comprises a biasing circuit. The biasing circuit is configured to apply a voltage or current bias to the plurality of SRAM bitcells in response to receiving the reset input. The power collapsing circuit is further configured to restore the power supplied by the power supply to the plurality of SRAM bitcells from the collapsed power level to the operational power level while the voltage or current bias is applied by the biasing circuit to the plurality of SRAM bitcells to cause the plurality of SRAM bitcells to reset to a desired state. In this manner, the plurality of SRAM bitcells can be reset in a single reset operation without having to increase a drive strength of a reset circuit configured to reset the state of the SRAM bitcells. Further, the biasing circuit provided herein can also avoid the need to provide specialized SRAM bitcells to allow for resetting of a plurality of SRAM bitcells in a single reset operation, where each specialized SRAM bitcell includes one or more additional transistors capable of forcing the SRAM bitcells to reset to the desired state.

In another embodiment, a data entry valid circuit for performing a reset operation on a plurality of SRAM bitcells in a SRAM is provided. The data entry valid circuit comprises a power collapsing circuit means comprising a collapsing means for collapsing power supplied by a power supply means to a plurality of SRAM bitcells in a SRAM means from an operational power level to a collapsed power level lower than the operational power level in response to receiving a reset input. The data entry valid circuit further comprises a biasing circuit means for applying a voltage or current bias to the plurality of SRAM bitcells in response to receiving the reset input. The power collapsing circuit means further comprising a restoring means for restoring the power supplied by the power supply means to the plurality of SRAM bitcells from the collapsed power level to the operational power level while the voltage or current bias is applied by the biasing circuit means to the plurality of SRAM bitcells to cause the plurality of SRAM bitcells to reset to a desired state.

In another embodiment, a method of resetting a plurality of SRAM bitcells in a SRAM to a desired state is provided. The method comprises receiving a reset input for resetting each of a plurality of SRAM bitcells. The method further comprises collapsing power supplied by a power supply to the plurality of SRAM bitcells in a SRAM from an operational power level to a collapsed power level lower than the operational power level in response to receiving the reset input. The method further comprises applying a voltage or current bias to the plurality of SRAM bitcells in response to receiving the reset input. The method also comprises restoring the power supplied by the power supply to the plurality of SRAM bitcells from the collapsed power level to the operational power level while the voltage or current bias is applied to the plurality of SRAM bitcells to cause the plurality of SRAM bitcells to reset to a desired state.

In another embodiment, a SRAM for storing index values in a tag array is provided. The SRAM comprises a data entry valid circuit for performing a reset operation on a plurality of SRAM bitcells in a SRAM. The data entry valid circuit comprises a power collapsing circuit. The power collapsing circuit is configured to collapse power supplied by a power supply to the plurality of SRAM bitcells in the SRAM from an operational power level to a collapsed power level lower than the operational power level in response to receiving a reset input. The data entry valid circuit further comprises a biasing circuit. The biasing circuit is configured to apply a voltage or current bias to the plurality of SRAM bitcells in response to receiving the reset input. The power collapsing circuit is further configured to restore the power supplied by the power supply to the plurality of SRAM bitcells from the collapsed power level to the operational power level while the voltage or current bias is applied by the biasing circuit to the plurality of SRAM bitcells to cause the plurality of SRAM bitcells to reset to a desired state. The SRAM further comprises a tag array comprised of a plurality of SRAM tag array rows for storing index values. Each SRAM tag array row of the plurality of SRAM tag array rows comprises a plurality of SRAM tag array bitcells. The SRAM further comprises a wordline decoder comprised of a plurality of wordlines coupled to each SRAM bitcell of the plurality of SRAM bitcells in the data entry valid circuit, wherein the wordline decoder is configured to control access to the plurality of SRAM bitcells.

DETAILED DESCRIPTION

Figure 1:
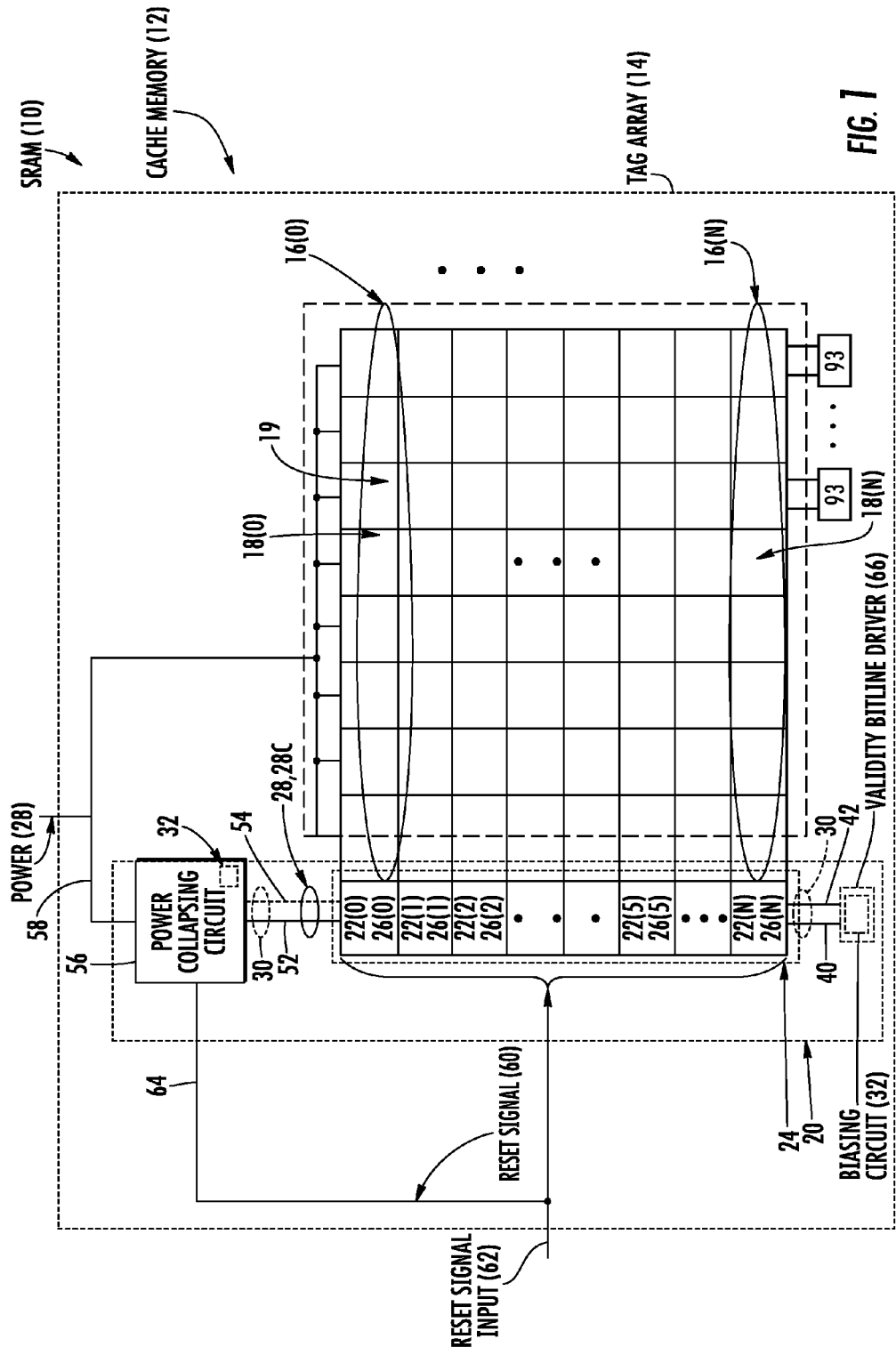
FIG. 1 is a block diagram of an exemplary static random access memory (SRAM) comprising a data entry valid circuit configured to apply a voltage or current bias to a plurality of SRAM bitcells in the data entry valid circuit during a SRAM reset operation to reset a state of the plurality of SRAM bitcells in the data entry valid circuit in a single reset operation.

With reference now to the drawing figures, several exemplary embodiments of the present disclosure are described. The word "exemplary" is used herein to mean "serving as an example, instance, or illustration." Any embodiment described herein as "exemplary" is not necessarily to be construed as preferred or advantageous over other embodiments.

Embodiments disclosed in the detailed description include circuits for voltage or current biasing static random access memory (SRAM) bitcells during SRAM reset operations. Related systems and methods are also disclosed. As one non-limiting example, the SRAM bitcells are included in an SRAM cache memory provided in a central processing unit (CPU) system. It may be desired to reset a plurality of SRAM bitcells to a desired state in a single reset operation, as opposed to a more time consuming method of resetting the state of each SRAM bitcell individually. For example, it may be desired to perform a reset invalidate operation for invalidating a plurality of SRAM bitcells used as valid bits in a cache memory efficiently in a single reset operation.

In this regard, in embodiments disclosed herein, to reset a plurality of SRAM bitcells in a single reset operation, a biasing circuit is provided and coupled to a plurality of SRAM bitcells. The biasing circuit is configured to apply a voltage or current bias to each of the plurality of SRAM bitcells during the single reset operation after power provided to the SRAM bitcells is collapsed to a collapsed power level below an operational power level of the SRAM bitcells. Collapsing power to the SRAM bitcells collapses the voltage in SRAM bitcells allowing the write operation to more easily occur. The voltage or current bias is applied by the biasing circuit to the SRAM bitcells as power to the SRAM bitcells is restored to an operational power level, thus forcing the SRAM bitcells into a desired state. Collapsing the power provided to the SRAM bitcells allows the biasing circuit to force a state in the plurality of SRAM bitcells with less drive strength than would otherwise be required if power provided to the SRAM bitcells was not collapsed and the biasing circuit had to overcome the voltage stored in the SRAM bitcells when an operational power is provided to the SRAM bitcells. In this manner, a plurality of SRAM bitcells can be reset in a single reset operation without having to increase the drive strength of a reset circuit configured to reset the state of the SRAM bitcells. Even with increased drive strength, it may not always be enough to correctly reset the SRAM bitcells to a desired state. Further, the biasing circuit provided herein can also avoid the need to provide specialized SRAM bitcells to allow for resetting of a plurality of SRAM bitcells in a single reset operation, where each specialized SRAM bitcell includes one or more additional transistors capable of forcing the SRAM bitcells to a desired state.

In this regard, FIG. 1 is a schematic diagram of an exemplary SRAM 10 for voltage or current biasing SRAM bitcells in a data entry valid circuit in a single reset operation. As an example, the SRAM 10 in FIG. 1 may be used as cache memory in a central processing unit (CPU) system. Before discussing the voltage or current biasing of the SRAM bitcells during reset operations, the SRAM 10 and its exemplary components are first described below.

With reference to FIG. 1, the SRAM 10 is a cache memory 12 in this example. The cache memory 12 is comprised of a SRAM tag array 14 (also referred to herein as "tag array") and a data array (not shown). The tag array 14 is comprised of a plurality of SRAM bitcell rows 16(0)-16(N) for storing a plurality of data entries 18(0)-18(N). The plurality of data entries 18(0)-18(N) stored in the plurality of SRAM bitcell rows 16(0)-16(N) may be otherwise known as a plurality of tag bits 18(0)-18(N). Each of the plurality of SRAM bitcell rows 16(0)-16(N) is comprised of a plurality of SRAM tag array bitcells 19. The plurality of tag bits 18(0)-18(N) has an associated data bits in the cache memory 12. The tag array 14 is further comprised of a data entry valid circuit 20 for storing validity states indicating whether each one of the plurality of tag bits 18(0)-18(N) stored in the corresponding plurality of SRAM bitcell rows 16(0)-16(N) are valid or invalid. As an example, the individual tag bit 18(0) is valid if the data stored in the data array of the cache memory 12 corresponding to the tag bit 18(0) is valid. The data stored in the data array of the cache memory 12 is valid if the data has been updated to be coherent with the data stored at a memory address of a memory access request in higher level memory (not shown).

With continued reference to FIG. 1, the data entry valid circuit 20 is comprised of a plurality of validity bits 22(0)-22(N) provided in a validity SRAM bitcell column 24 of the tag array 14. The validity bits 22(0)-22(N) are SRAM bitcells. Each of the validity bits 22(0)-22(N) of the data entry valid circuit 20 in this example corresponds to a validity state of each one of the SRAM bitcell rows 16(0)-16(N) corresponding to a respective tag bits 18(0)-18(N). Each of the validity bits 22(0)-22(N) may be a single SRAM bitcell. Thus, the validity SRAM bitcell column 24 will be comprised of a plurality of SRAM bitcells 26(0)-26(N) for storing a validity state of each of the plurality of tag bits 18(0)-18(N). The state of the validity bits 22(0)-22(N) in the data entry valid circuit 20 may be one of two (2) stable states (e.g., logical high "1" or logical low "0") representing the validity of the plurality of tag bits 18(0)-18(N) stored in the tag array 14.

With continued reference to FIG. 1, upon power up of the cache memory 12 with power 28 supplied from a power source (not shown) to the SRAM bitcells 26(0)-26(N), voltage levels stored in the validity bits 22(0)-22(N) are unpredictable, resulting in random validity states in the validity bits 22(0)-22(N). As a result of random validity states stored in the validity bits 22(0)-22(N) at power up, it may be desired for current states of the validity bits 22(0)-22(N) in the data entry valid circuit 20 to be reset or invalidated on power-up. In this manner, if data entries in the cache memory 12 corresponding to any of the tag bits 18(0)-18(N) are accessed before the data entries contain valid data validity bits 22(0)-22(N) will have been reset to an invalidate state causing a cache miss to occur. The invalid data entries will not be accessed as a result of the cache miss. The states of the validity bits 22(0)-22(N) may be reset by setting the value of the SRAM bitcells 26(0)-26(N) comprised in the validity bits 22(0)-22(N) to a logical low "0", as an example.

With continued reference to FIG. 1, to reset the state of the SRAM bitcells 26(0)-26(N), a voltage or current bias 30 is applied by a biasing circuit 32 to the SRAM bitcells 26(0)-26(N) in the validity SRAM bitcell column 24. The voltage or current bias 30 is applied, providing sufficient drive strength (i.e., current capacity) to overcome any existing charge or voltage levels presently stored in the SRAM bitcells 26(0)-26(N). In addition, it may be desired to reset all or at least a plurality of the SRAM bitcells 26(0)-26(N) in the validity SRAM bitcell column 24 in a single reset operation. Thus, for the biasing circuit 32 to be capable of resetting the state of all the SRAM bitcells 26(0)-26(N) in a single reset operation, the biasing circuit 32 must provide sufficient drive strength to reset all of the SRAM bitcells 26(0)-26(N).

Figure 2:
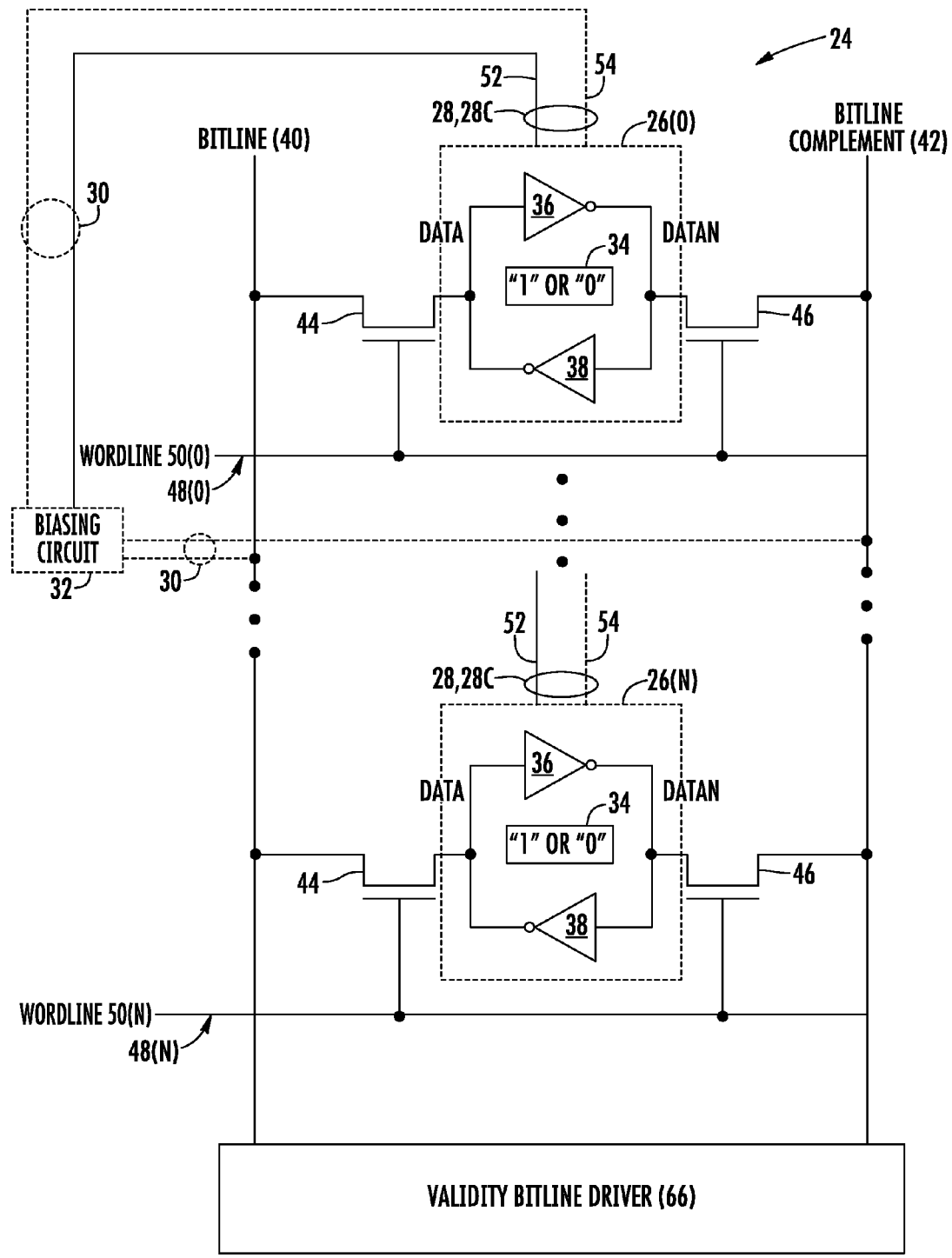
FIG. 2 is a column of six-transistor (6T) SRAM bitcells in the data entry valid circuit of FIG. 1, wherein the column of SRAM bitcells is configured to receive a voltage or current bias applied by a biasing circuit during the SRAM reset operation to reset a state of the column of SRAM bitcells in a single reset operation.

With continued reference to FIG. 1, additional detail of the validity SRAM bitcell column 24 comprising the SRAM bitcells 26(0)-26(N) is provided in FIG. 2. Referring to FIG. 2, the value of the SRAM bitcells 26(0)-26(N) may be reset by storing or writing a single bit of information 34 in the SRAM bitcells 26(0)-26(N). The single bit of information 34 is represented by a voltage charge level stored in a first storage node DATA and a second storage node DATAN, as an example. The first storage node DATA and the second storage node DATAN are formed by two (2) cross-coupled inverters 36, 38 provided in the SRAM bitcells 26(0)-26(N). Because of the manner in which the SRAM bitcells 26(0)-26(N) read and write the single bit of information 34, the two (2) cross-coupled inverters 36, 38 are complementary to each other. Collapsing the power 28 supplied to the SRAM bitcells 26(0)-26(N) to a collapsed power level 28C causes a collapse in the voltage charge level stored in the two (2) cross-coupled inverters 36, 38 in the SRAM bitcells 26(0)-26(N). To perform the reset operation in a single cycle, the voltage charge level stored in the two (2) cross-coupled inverters 36, 38 in the SRAM bitcells 26(0)-26(N) is collapsed. The voltage or current bias 30 may be applied by the biasing circuit 32 with less drive strength than would otherwise be required if the power 28 provided to the SRAM bitcells 26(0)-26(N) was not collapsed to the collapsed power level 28C from an operational power level. Without the biasing circuit 32, it would require either specialized SRAM bitcells or a validity bitline driver with increased drive strength, each of which increase SRAM cache memory density.

With continued reference to FIG. 2, the voltage or current bias 30 may be applied by the biasing circuit 32 to the SRAM bitcells 26(0)-26(N) using different techniques. In a first embodiment, described in greater detail below in FIG. 4, the biasing circuit 32 applies the voltage or current bias 30 on a bitline 40 and a bitline complement 42. In this first embodiment, a first access transistor 44 and a second access transistor 46 in FIG. 2 are provided to control access to the SRAM bitcells 26(0)-26(N) during reset operations, similar to a read or write operation. Access to the SRAM bitcells 26(0)-26(N) is enabled by the activation of the two (2) access transistors 44, 46. The activation of the two (2) access transistors 44, 46 causes the bitline 40 and the bitline complement 42 to become coupled to the two (2) cross-coupled inverters 36, 38. The activation of the two (2) access transistors 44, 46 is enabled by a wordline signal 48(0)-48(N) asserted on wordlines 50(0)-50(N) by the cache memory 12 in FIG. 1. The voltage or current bias 30 applied by the biasing circuit 32 to the bitline 40 and the bitline complement 42 representing the single bit of information 34 will be stored or written in the two (2) cross-coupled inverters 36, 38 in each of the SRAM bitcells 26(0)-26(N) to be reset. In this manner, the SRAM bitcells 26(0)-26(N) may be reset in a single reset operation in the validity SRAM bitcell column 24, based on the asserted wordlines 50(0)-50(N). In a second embodiment, described in greater detail in FIG. 6, the biasing circuit 32 applies the voltage or current bias 30 via a first power collapsing output 52 and a second power collapsing output 54. The first power collapsing output 52 and the second power collapsing output 54 are each coupled to one of the two (2) cross-coupled inverters 36, 38. The voltage or current bias 30 applied via the first power collapsing output 52 and the second power collapsing output 54 creates a differential voltage across the two (2) cross-coupled inverters 36, 38. The differential voltage across the two (2) cross-coupled inverters 36, 38 causes the SRAM bitcells 26(0)-26(N) to reset to a desired state. The SRAM bitcells 26(0)-26(N) in both exemplary embodiments may be provided as standard 6-T SRAM bitcells.

With continued reference to FIG. 1, the data entry valid circuit 20 is further comprised of a power collapsing circuit 56 for collapsing the power 28 supplied at an operational power level to the SRAM bitcells 26(0)-26(N) during a reset operation. The power collapsing circuit 56 is configured to receive the power 28 supplied at a data entry valid circuit power input 58. The power 28 supplied to the power collapsing circuit 56 is supplied at an operational power level for the cache memory 12. An operational power level is a minimum voltage level required for the SRAM bitcells 26(0)-26(N) in the cache memory 12 to function correctly in normal read or write operations by being able to persistently store data. The power collapsing circuit 56 is further configured to collapse the power level of the power 28 to a reduced power level below the operational power level required to keep the SRAM bitcells 26(0)-26(N) operational, which is known as a collapsed power level 28C. The power collapsing circuit 56 is also configured to provide the power 28 at an operational power level to the SRAM bitcells 26(0)-26(N). The data entry valid circuit 20 receives a reset signal 60 on a reset signal input 62. The power collapsing circuit 56 is also configured to receive the reset signal 60 at a data entry valid circuit reset input 64. In response to receiving the reset signal 60, the power collapsing circuit 56 initiates a collapse of the power 28 to the collapsed power level 28C supplied to the validity bits 22(0)-22(N). The power collapsing circuit 56 collapses the power 28 to a collapsed power level 28C below the operational power level supplied by the power 28 at the data entry valid circuit power input 58. With the power 28 collapsed to the collapsed power level 28C below the operational power level, the biasing circuit 32 is configured to apply the voltage or current bias 30 to the SRAM bitcells 26(0)-26(N). Applying the voltage or current bias 30 by the biasing circuit 32 while the power 28 is collapsed to the collapsed power level 28C below the operational power level will cause the voltage charge in the SRAM bitcells 26(0)-26(N) to be biased towards the state corresponding to the applied voltage or current bias 30. The voltage or current bias 30 applied by the biasing circuit 32 will cause the state of the SRAM bitcells 26(0)-26(N) to be reset to the desired state.

With continued reference to FIG. 1, the power collapsing circuit 56 is further configured to restore the power 28 from the collapsed power level 28C supplied to the plurality of SRAM bitcells 26(0)-26(N) from the collapsed power level 28C to the operational power level. The collapsed power level 28C is restored to the operational power level while the voltage or current bias 30 is applied by the biasing circuit 32 to the plurality of SRAM bitcells 26(0)-26(N). With the differential voltage applied across the SRAM bitcells 26(0)-26(N), restoring the collapsed power level 28C to the operational power level causes the plurality of SRAM bitcells 26(0)-26(N) to hold the current voltage charge levels at the desired state. The current voltage charge levels corresponding to the desired state are a result from the applied voltage or current bias 30 to the SRAM bitcells 26(0)-26(N) at the desired state. After the collapsed power level 28C is restored to the operational power level, the voltage or current bias 30 is no longer applied.

With continued reference to FIG. 1, in an alternative embodiment, the biasing circuit 32 may be provided for in the power collapsing circuit 56 instead of in a validity bitline driver 66. This alternative embodiment will be described in further detail in FIG. 6. The biasing circuit 32 may be provided for in the power collapsing circuit 56, wherein the voltage or current bias 30 is applied by the biasing circuit 32 via the first power collapsing output 52 and, optionally, the second power collapsing output 54 to internal nodes of the SRAM bitcells 26(0)-26(N) through the two cross-coupled inverters 36, 38. The power 28 provided on the first power collapsing output 52 and the second power collapsing output 54 at an operational power level is simultaneously collapsed for the two cross-coupled inverters 36, 38 to the collapsed power level 28C. The power 28 is restored to the operational power level initially on the first power collapsing output 52. Then after some delay, the power 28 is restored to the operational power level on the second power collapsing output 54, thereby enforcing the desired value on the internal storage nodes of the SRAM bitcells 26(0)-26(N). In this manner, the SRAM bitcells 26(0)-26(N) may be provided without the need to provide specialized SRAM bitcells or a validity bitline driver with an increased drive strength, each of which increase SRAM cache memory density.

Figure 3:
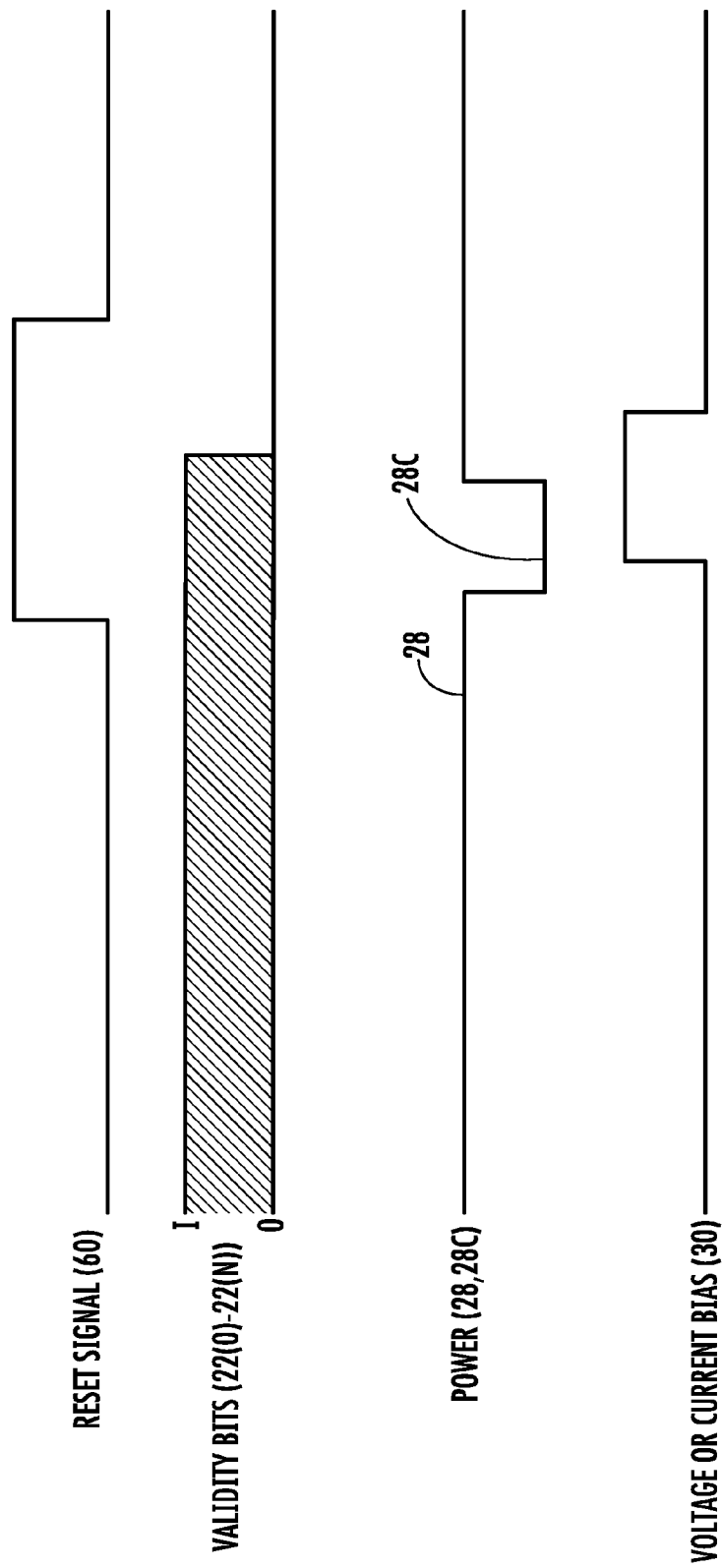
FIG. 3 is a timing diagram of an exemplary SRAM reset operation performed by the data entry valid circuit of FIG. 1 for a plurality of SRAM bitcells in the data entry valid circuit.

FIG. 3 is a timing diagram of an exemplary SRAM reset operation performed on the validity bits 22(0)-22(N) in the data entry valid circuit 20 of FIG. 1. The exemplary SRAM reset operation performed is a single reset operation using the voltage or current bias 30 applied by the biasing circuit 32 to reset the validity bits 22(0)-22(N) as desired. Upon initial power up of the cache memory 12, each of the plurality of validity bits 22(0)-22(N) of the data entry valid circuit 20 contain a random or unknown state of either a logical one ("1") or a logical zero ("0"), where a logical zero ("0") may represent an invalid state. The reset signal 60 is used by the data entry valid circuit 20 to trigger a reset of the SRAM bitcells 26(0)-26(N) provided as the validity bits 22(0)-22(N) in a single reset operation. Asserting the reset signal 60 causes the power collapsing circuit 56 in the data entry valid circuit 20 to collapse the power 28 to the collapsed power level 28C below the operational power level. With the collapsing of the power 28 to the collapsed power level 28C, the biasing circuit 32 applies the voltage or current bias 30 to the SRAM bitcells 26(0)-26(N) to reset the state of the SRAM bitcells 26(0)-26(N) in the data entry valid circuit 20.

In continued reference to FIG. 3, while the voltage or current bias 30 is applied by the biasing circuit 32 to the SRAM bitcells 26(0)-26(N) in the data entry valid circuit 20, the power 28 is restored from the collapsed power level 28C to the operational power level by the power collapsing circuit 56. After the power 28 to the SRAM bitcells 26(0)-26(N) is restored from the collapsed power level 28C to the operational power level, the voltage or current bias 30 is de-asserted by the biasing circuit 32. In this manner, the reset signal 60 triggers the biasing circuit 32 to reset the state of the SRAM bitcells 26(0)-26(N) provided as the validity bits 22(0)-22(N) in the data entry valid circuit 20 to a logical zero ("0"), or to an invalid state, in a single reset operation.

As described above, the voltage or current bias 30 may be applied by the biasing circuit 32 to reset the state of the SRAM bitcells 26(0)-26(N) using several different methods. As an example, one way of applying the voltage or current bias 30 to the SRAM bitcells 26(0)-26(N) is by providing the biasing circuit 32 in the validity bitline driver 66, wherein the biasing circuit 32 applies the voltage or current bias 30 on the bitline 40 and the bitline complement 42 to bias the SRAM bitcells 26(0)-26(N) to a desired state with corresponding the wordlines 50(0)-50(N) turned on for the SRAM bitcells 26(0)-26(N).

Figure 4:
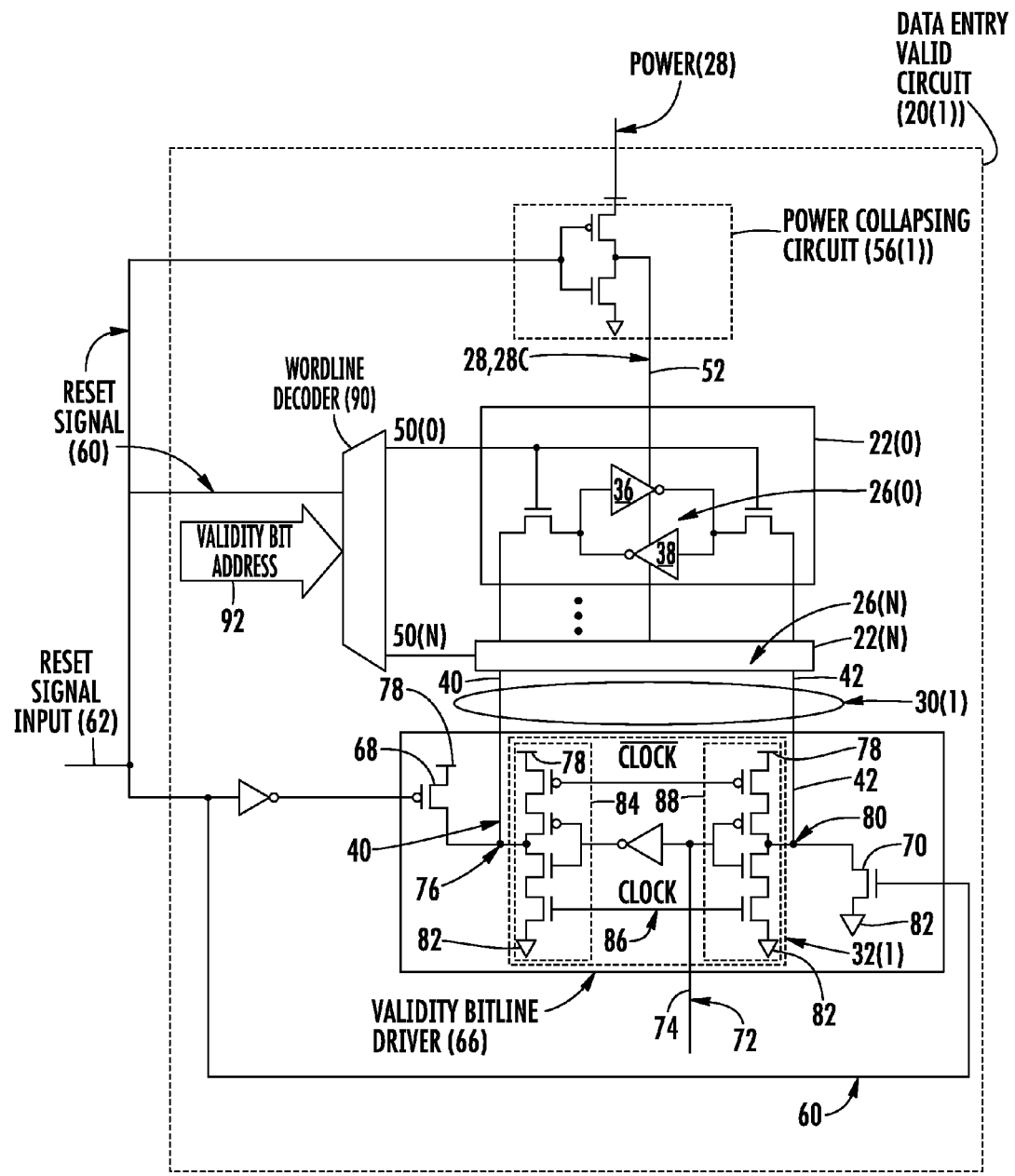
FIG. 4 is a block diagram of an exemplary data entry valid circuit that may be provided in the SRAM in FIG. 1, wherein a validity bitline driver includes the biasing circuit configured to apply a voltage or current bias to a plurality of SRAM bitcells in the data entry valid circuit during a SRAM reset operation to reset a state of the plurality of SRAM bitcells in a single reset operation.

In this regard, FIG. 4 illustrates an exemplary embodiment of a data entry valid circuit 20(1), wherein a biasing circuit 32(1) is provided in the validity bitline driver 66. FIG. 4 illustrates common elements previously described in FIG. 1. The data entry valid circuit 20(1) described below will be described with additional detail regarding how the voltage or current bias 30 is applied. The data entry valid circuit 20(1) is configured to reset a state of the SRAM bitcells 26(0)-26(N) provided as the validity bits 22(0)-22(N) in the data entry valid circuit 20(1) in a single reset operation. The data entry valid circuit 20(1) comprises a validity bitline driver 66 which applies a voltage or current bias 30(1) to a bitline 40 and to a bitline complement 42. The validity bitline driver 66 comprises a biasing circuit 32(1), which places the voltage or current bias 30(1) on the bitline 40 and the bitline complement 42. The validity bitline driver 66 is comprised of the bitline 40 and the bitline complement 42 coupled to each of a plurality of SRAM bitcells 26(0)-26(N). The voltage or current bias 30(1) is applied to the bitline 40 and the bitline complement 42 to reset the SRAM bitcells 26(0)-26(N) as desired. In this example, because the voltage or current bias 30(1) is applied to the SRAM bitcells 26(0)-26(N) via the bitline 40 and the bitline complement 42, the SRAM bitcells 26(0)-26(N) may be reset in the same manner as storing or writing a value in the SRAM bitcells 26(0)-26(N) in the SRAM bitcell rows 16(0)-16(N) in FIG. 1. It should also be noted that the validity bitline driver 66 is similar to a standard bitline driver for a standard 6-T SRAM bitcell. While the validity bitline driver 66 is similar to a standard bitline driver for a 6-T SRAM bitcell, the validity bitline driver 66 is configured to receive a reset signal 60 to trigger the applying of the voltage or current bias 30(1) in the reset operation.

With continued reference to FIG. 4, the data entry valid circuit 20(1) functions in a consistent manner to the data entry valid circuit 20 of FIG. 1 as described above. The data entry valid circuit 20(1) is comprised of a power collapsing circuit 56(1) for collapsing the power 28 to a collapsed power level 28C on the first power collapsing output 52. However, in this exemplary embodiment, the second power collapsing output 54 is not used. The power collapsing circuit 56(1) uses a received reset signal 60 to trigger a collapse in the power 28 to the collapsed power level 28C supplied to the SRAM bitcells 26(0)-26(N) on the first power collapsing output 52. With the power 28 to the SRAM bitcells 26(0)-26(N) collapsed to the collapsed power level 28C, the voltage or current bias 30(1) is applied to the bitline 40 and to the bitline complement 42 by the biasing a first biasing circuit switch 68 and a second biasing circuit switch 70. A desired data state 72 received on a desired data state input 74 may be used to write the SRAM bitcells 26(0)-26(N) to either a logical low ("0") or a logical high ("1").

With continued reference to FIG. 4, the reset signal 60 is received by the biasing circuit 32(1) at a first biasing circuit switch 68 and a second biasing circuit switch 70 to trigger applying a predefined voltage or current bias 30(1) by the biasing circuit 32(1). The voltage or current bias 30(1) may be hard coded to apply a predefined state to the SRAM bitcells 26(0)-26(N) to either a logical low ("0") or a logical high ("1"). In this non-limiting example, the first biasing circuit switch 68 receives the reset signal 60, causing a bitline node 76 to couple from a voltage rail node 78 while the reset signal 60 is asserted on the reset signal input 62. This will apply a logical one ("1") to the bitline 40. The second biasing circuit switch 70 will also use the reset signal 60 received at the reset signal input 62. However, the second biasing circuit switch 70 will cause a bitline complement node 80 to couple to a ground rail node 82 while the reset signal 60 is asserted at the reset signal input 62. This will apply a logical zero ("0") to the bitline complement 42. In this manner, the state of each of the SRAM bitcells 26(0)-26(N) will be set to a logical one ("1"). The wordlines 50(0)-50(N) allow access to all or only some of the SRAM bitcells 26(0)-26(N) in the data entry valid circuit 20(1) based on receiving the reset signal 60. A wordline decoder 90 will decode a received validity bit address 92, mapping the received validity bit address 92 to the corresponding wordlines 50(0)-50(N). The validity bit address 92 received by the wordline decoder 90 may specify all or only a range of the SRAM bitcells 26(0)-26(N) to reset to a desired state.

With continued reference to FIG. 4, the SRAM bitcells 26(0)-26(N) may be set to a configurable state, either a logical zero ("0") or a logical one ("1"). The state of the SRAM bitcells 26(0)-26(N) is configurable based on the received desired data state 72. A bitline biasing circuit 84 will couple the bitline node 76 to the ground rail node 82 when the state on the desired data state 72 is low, and to the voltage rail node 78 when the state on the desired data state 72 is high with the rising edge of a system clock 86. Further, a bitline complement biasing circuit 88 will couple the bitline complement node 80 to the voltage rail node 78 when the state on the desired data state 72 is low, and to the ground rail node 82 when the state on the desired data state 72 is high with the rising edge of the system clock 86. Thus, the bitline 40 is set to a similar state as the desired data state 72 and the bitline complement 42 is set to an opposite state of the desired data state 72, causing the SRAM bitcells 26(0)-26(N) in the validity bits 22(0)-22(N) to become biased corresponding to the received desired data state 72 based on the rising edge of the system clock 86. The wordlines 50(0)-50(N) allow access to all or only some of the SRAM bitcells 26(0)-26(N) in the data entry valid circuit 20(1). A wordline decoder 90 will decode a received validity bit address 92, mapping the received validity bit address 92 to the corresponding wordlines 50(0)-50(N). The validity bit address 92 received by the wordline decoder 90 may specify all or only a range of the SRAM bitcells 26(0)-26(N) to reset to a desired state.

With continued reference to FIG. 4, while the voltage or current bias 30(1) is applied by the biasing circuit 32(1), the power collapsing circuit 56(1) restores the power 28 from the collapsed power level 28C back to an operational power level. Restoring the power 28 from the collapsed power level 28C back to the operational power level will reset the state of the validity bits 22(0)-22(N) to a predefined state. Because the power 28 to the SRAM bitcells 26(0)-26(N) is collapsed to the collapsed power level 28C while the voltage or current bias 30(1) is applied, the validity bitline driver 66 may reset the SRAM bitcells 26(0)-26(N) without increased drive strength. The validity bitline driver 66 may not require increased drive strength because as the power 28 to the SRAM bitcells 26(0)-26(N) is collapsed to the collapsed power level 28C, the operational power level provided to the SRAM bitcells 26(0)-26(N) is collapsed. In this manner, it may be desired to not design the validity bitline driver 66 as specialized validity bitline drivers for the data entry valid circuit 20(1) with increased drive strength. As a result, the validity bitline driver 66 may be similar to bitline drivers 93 used for the SRAM bitcell rows 16(0)-16(N) in the tag array 14 in the cache memory 12 in FIG. 1. The validity bitline driver 66 may also provide a drive strength that is equal to or greater than the drive strength of the bitline drivers 93 used for the SRAM bitcell rows 16(0)-16(N) in the tag array 14 in the cache memory 12. Designing bitline drivers elsewhere in the tag array 14 that are different from the validity bitline driver 66 may require smaller geometries, additional transistors, or unique process technologies during manufacturing of the data entry valid circuit 20(1). Thus, a single reset operation of the SRAM bitcells 26(0)-26(N) may be performed in a single step without the necessity of creating specialized SRAM bitcells with additional transistors (e.g., in addition to the transistors provided in a 6T SRAM bitcell) providing added cost and area. The SRAM bitcells 26(0)-26(N) may be provided as standard 6-T SRAM bitcells.

Figure 5:
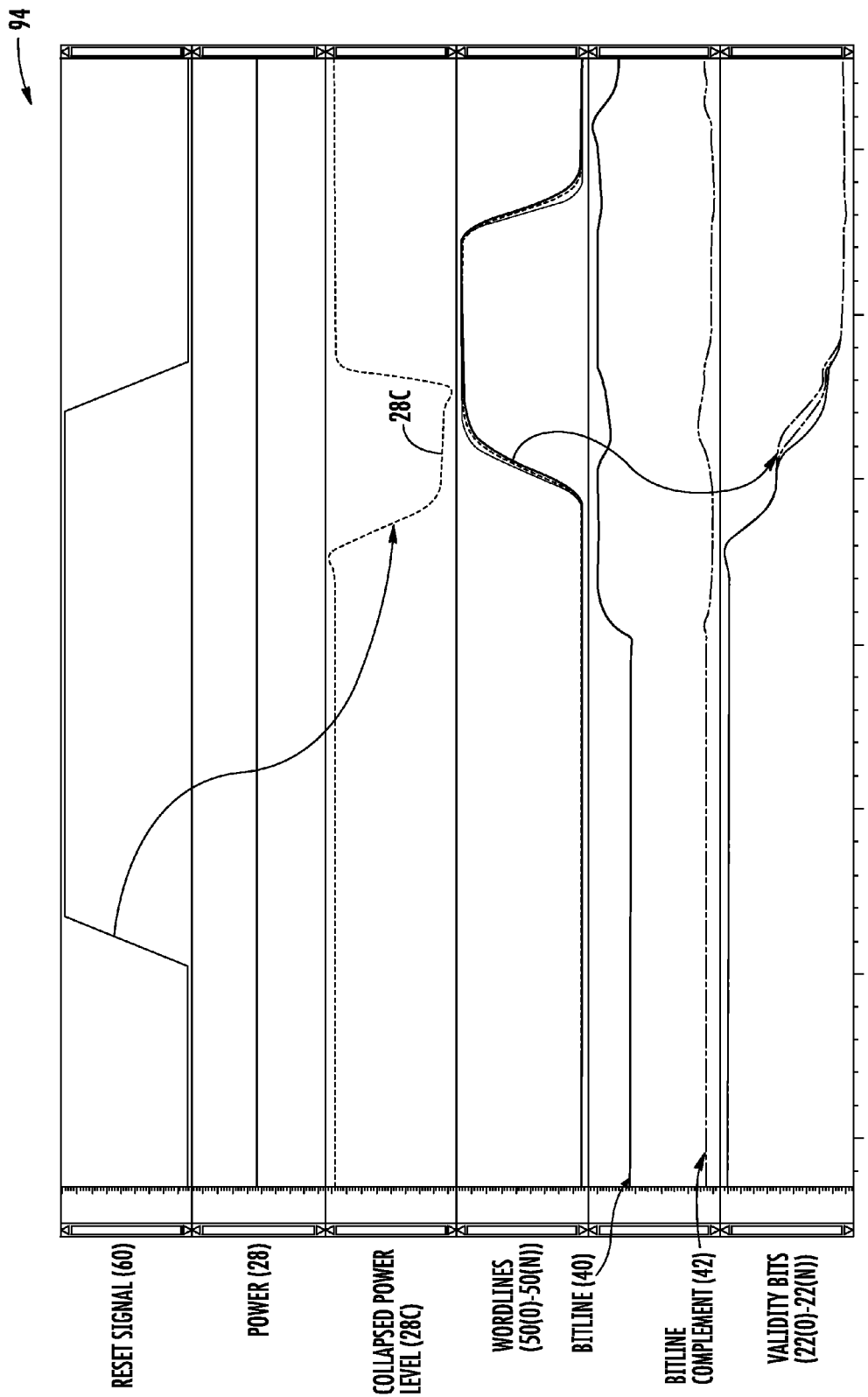
FIG. 5 is a timing diagram of an exemplary SRAM reset operation performed by the data entry valid circuit of FIG. 3 for a plurality of SRAM bitcells in the data entry valid circuit.

FIG. 5 is a timing diagram 94 illustrating the voltage or current biasing of the exemplary data entry valid circuit 20(1) in FIG. 3 by applying a voltage or current bias 30(1) to the validity bits 22(0)-22(N) during a single reset operation. The data entry valid circuit 20(1) is configured to use the biasing circuit 32(1) provided in the validity bitline driver 66 to apply the voltage or current bias 30(1). The timing diagram 94 illustrates receiving the reset signal 60 from the reset signal input 62. The reset signal 60 initiates the reset operation in the data entry valid circuit 20(1). The power 28 provides a constant source of power at an operational level to the power collapsing circuit 56(1). The power collapsing circuit 56(1) collapses the power 28 to the collapsed power level 28C sufficient for the voltage or current bias 30(1) applied by the biasing circuit 32(1) to reset the SRAM bitcells 26(0)-26(N) in the data entry valid circuit 20(1). In this exemplary embodiment, the biasing circuit 32(1) applies the voltage or current bias 30(1) to the bitline 40 and the bitline complement 42. While the power 28 to the SRAM bitcells 26(0)-26(N) is collapsed to the collapsed power level 28C, the biasing circuit 32(1) applies the voltage or current bias 30(1) to the SRAM bitcells 26(0)-26(N) via the bitline 40 and the bitline complement 42. With the power 28 to the SRAM bitcells 26(0)-26(N) collapsed and the voltage or current bias 30(1) applied to the bitline 40 and the bitline complement 42 by the biasing circuit 32(1), all or few wordline signals 48(0)-48(N) are asserted on the wordlines 50(0)-50(N) based on the validity bit address 92.

With continued reference to FIG. 5, by asserting the wordlines 50(0)-50(N) coupled to the SRAM bitcells 26(0)-26(N), access to the corresponding SRAM bitcells 26(0)-26(N) of the data entry valid circuit 20(1) is enabled. Because the voltage or current bias 30(1) is applied with the power 28 provided to the SRAM bitcells 26(0)-26(N) collapsed to the collapsed power level 28C, the state of the SRAM bitcells 26(0)-26(N) in the data entry valid circuit 20(1) is reset to a logical zero ("0"), in this example. The state of each of the SRAM bitcells 26(0)-26(N) is reset based on the reset signal 60. The wordlines 50(0)-50(N) may also be configured to separately reset the state of particular SRAM bitcells 26(0)-26(N) as desired. After the wordlines 50(0)-50(N), the bitline 40, and the bitline complement 42 are driven, the power 28 is restored by the power collapsing circuit 56(1) from the collapsed power level 28C to the operational power level, thereby resetting the state of the SRAM bitcells 26(0)-26(N). Additionally, the wordline signals 48(0)-48(N) on the wordlines 50(0)-50(N) are de-asserted by the cache memory 12. As described above, the voltage or current bias 30 in FIG. 1 may be applied by the biasing circuit 32 to reset the state of the SRAM bitcells 26(0)-26(N) using several different methods. In an alternative embodiment, the voltage or current bias 30 of FIG. 1 may be applied by collapsing the power 28 supplied to the SRAM bitcells 26(0)-26(N) to a collapsed power level 28C through an optional second power collapsing output 54. As the power 28 to the SRAM bitcells 26(0)-26(N) is restored, a differential voltage across the internal nodes of the SRAM bitcells 26(0)-26(N) is created, thus biasing the SRAM bitcells 26(0)-26(N) to a desired state.

Figure 6:
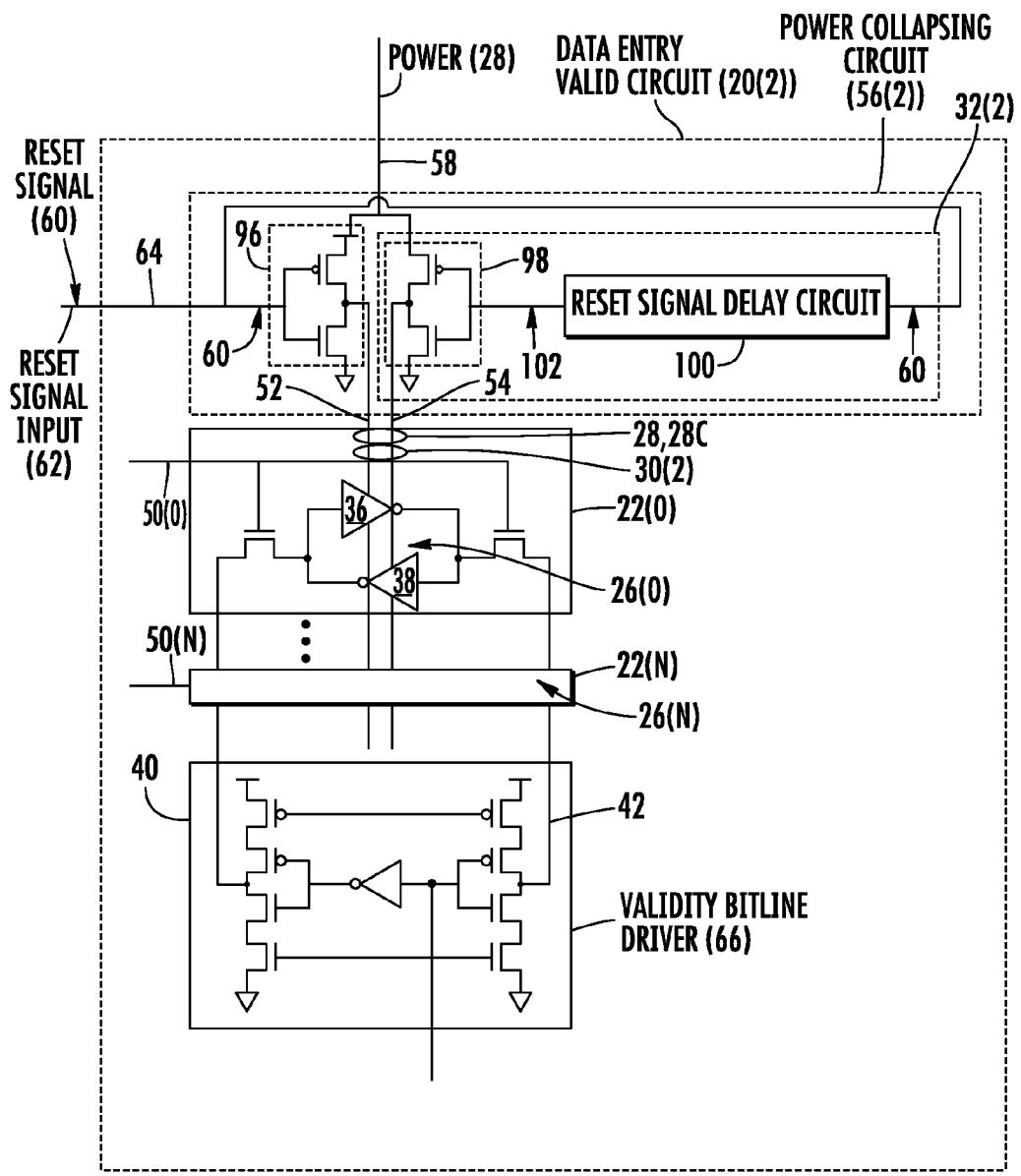
FIG. 6 is a block diagram of another exemplary embodiment of a data entry valid circuit in FIG. 1 comprising a power collapsing circuit provided as a biasing circuit, wherein the power collapsing circuit is configured to collapse power from two (2) independent power sources supplying power to a plurality of SRAM bitcells, and selectively delay restoration of power to one internal node of the SRAM bitcells during a single reset operation to apply a voltage or current bias to the plurality of SRAM bitcells to reset the state of the SRAM bitcells.

In this regard, FIG. 6 illustrates an exemplary embodiment of a data entry valid circuit 20(2) configured to reset the state of the validity bits 22(0)-22(N) provided as the SRAM bitcells 26(0)-26(N) in the data entry valid circuit 20(2) by applying a voltage or current bias 30(2) via two (2) power sources. The power 28 is provided to a power collapsing circuit 56(2) configured to collapse the power 28 to the SRAM bitcells 26(0)-26(N) to the collapsed power level 28C via two (2) power sources, the first power collapsing output 52 and the second power collapsing output 54. In this exemplary embodiment, a biasing circuit 32(2) for applying the voltage or current bias 30(2) is provided in the power collapsing circuit 56(2). The biasing circuit 32(2) applies the voltage or current bias 30(2) to the SRAM bitcells 26(0)-26(N) by restoring the collapsed power level 28C on the first power collapsing output 52 and the second power collapsing output 54 in a sequential or staggered fashion. The power 28 to the SRAM bitcells 26(0)-26(N) is restored in a sequential or staggered fashion by allowing the collapsed power level 28C on the first power collapsing output 52 to be restored to an operational power level prior to the collapsed power level 28C on the second power collapsing output 54.

With continued reference to FIG. 6, the data entry valid circuit 20(2) initially receives a reset signal 60 on the reset signal input 62. The reset signal 60 is received by the power collapsing circuit 56(2) for collapsing and restoring the collapsed power level 28C supplied to the data entry valid circuit 20(2). The power collapsing circuit 56(2) receives the power 28 supplied to the data entry valid circuit 20(2) at the data entry valid circuit power input 58. The power collapsing circuit 56(2) additionally receives the reset signal 60 at the reset signal input 62. The reset signal 60 is used by the power collapsing circuit 56(2) to trigger the collapse of the power 28 to the collapsed power level 28C supplied at the two (2) power sources, the first power collapsing output 52 from a first power collapsing circuit 96 and the second power collapsing output 54 from a second power collapsing circuit 98. The second power collapsing circuit 98 is provided in the biasing circuit 32(2). The biasing circuit 32(2) is further comprised of a reset signal delay circuit 100. The reset signal delay circuit 100 generates a second reset signal 102 to delay the restoration of the power 28 from the collapsed power level 28C at the second power collapsing circuit 98 to the operational power level. The second reset signal 102 from the reset signal delay circuit 100 will cause the second power collapsing circuit 98 to delay the restoration of the power 28 from the collapsed power level 28C at the second power collapsing output 54. The delay in the restoration of the power 28 at the second power collapsing output 54 creates a sequential or staggered restoration of the collapsed power level 28C. The sequential or staggered restoration of the collapsed power level 28C to the operational power level will create the voltage or current bias 30(2) on the SRAM bitcells 26(0)-26(N). The voltage or current bias 30(2) created by the staggered restoration of the power 28 supplied to the SRAM bitcells 26(0)-26(N) from the collapsed power level 28C to the operational power level alters a differential voltage across the SRAM bitcells 26(0)-26(N). Altering the differential voltage across the SRAM bitcells 26(0)-26(N) causes the voltage level stored in the SRAM bitcells 26(0)-26(N) to be reset to a desired state. It may also be desired to cause the power 28 to be restored from the collapsed power level 28C to the operational power level in a reversed manner, wherein the power collapsing circuit 56(2) may cause the power 28 at the second power collapsing output 54 to be restored prior to the power 28 at the first power collapsing output 52. In this manner, an opposite state may be stored in the SRAM bitcells 26(0)-26(N) as a desired state, based on the reversing of the order of restoring the power levels.

Figure 7:
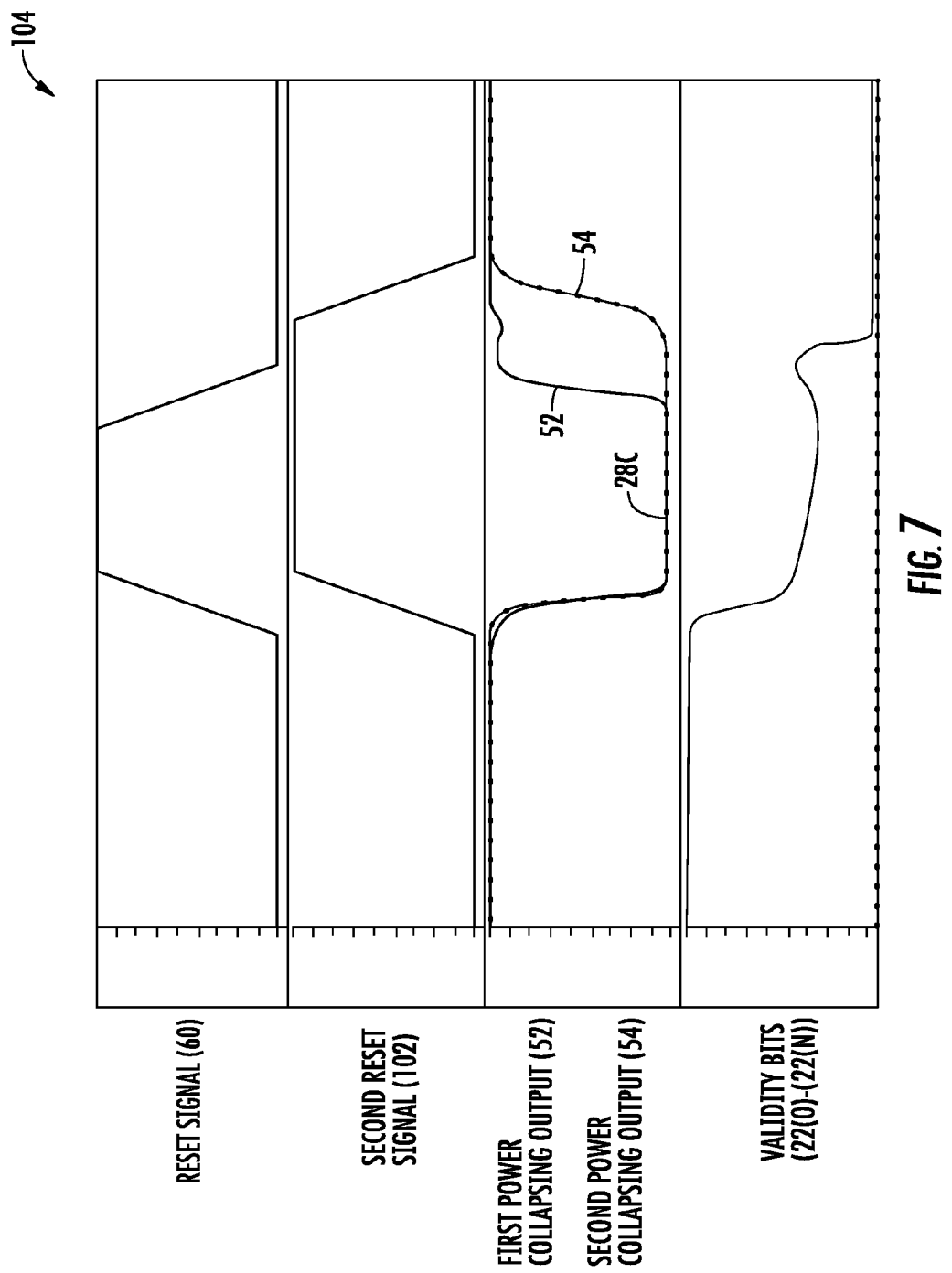
FIG. 7 is a timing diagram of an exemplary SRAM reset operation performed by the data entry valid circuit of FIG. 6 for a plurality of SRAM bitcells in the data entry valid circuit.

In this regard, FIG. 7 illustrates a timing diagram 104 of the exemplary data entry valid circuit 20(2) of FIG. 6 using a biasing circuit 32(2) to apply the voltage or current bias 30(2). The voltage or current bias 30(2) is applied by restoring the power 28 supplied to the SRAM bitcells 26(0)-26(N) from the collapsed power level 28C provided on the first power collapsing output 52 and the second power collapsing output 54 in a sequential or staggered fashion. The collapsing and sequential restoration of the collapsed power level 28C causes the states stored in the SRAM bitcells 26(0)-26(N) to be reset. The reset signal 60 is provided by the cache memory 12 in FIG. 1. The reset signal 60 is also received by the reset signal delay circuit 100 in the biasing circuit 32(2) for causing a delay in the restoration of the collapsed power level 28C on the second power collapsing output 54. The reset signal delay circuit 100 delays the reset signal 60, generating the second reset signal 102 provided as output to the second power collapsing circuit 98. As the reset signal 60 is received by the first power collapsing circuit 96 and the second reset signal 102 is received by the second power collapsing circuit 98, the first power collapsing output 52 and the second power collapsing output 54 are initially collapsed. The collapsing of both the first power collapsing output 52 and the second power collapsing output 54 to each of the SRAM bitcells 26(0)-26(N) causes the state of the validity bits 22(0)-22(N) to lose their current states. After a time sufficient for the validity bits 22(0)-22(N) to lose their current states, the reset signal 60 is de-asserted. The de-assertion of the reset signal 60 also causes the subsequent and delayed de-assertion of the second reset signal 102. As each of the respective signals, the reset signal 60 and the second reset signal 102, are de-asserted, the restoration of the collapsed power level 28C at the first power collapsing output 52 prior to the second power collapsing output 54 alters the differential voltage across the SRAM bitcells 26(0)-26(N). In this manner, altering the differential voltage across the SRAM bitcells 26(0)-26(N) causes the voltage level stored in the SRAM bitcells 26(0)-26(N) to be reset to a desired state.

Figure 8:
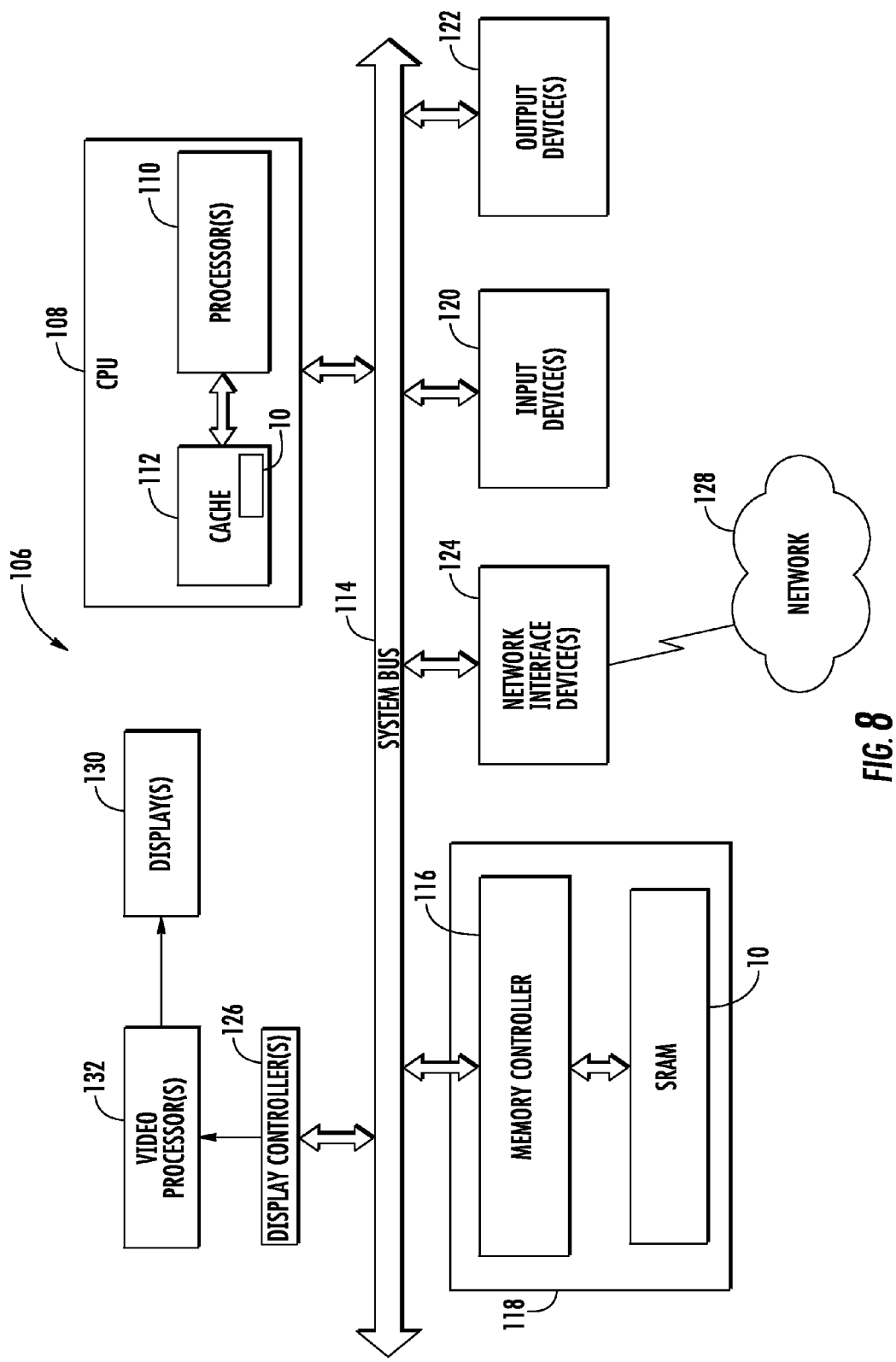
FIG. 8 is a block diagram of an exemplary processor-based system that can include the exemplary data entry valid circuits in FIGS. 1, 2, 3, and 5 as non-limiting examples for applying a voltage or current bias to a plurality of SRAM bitcells in a data entry valid circuit during a single reset operation to reset a state of the plurality of SRAM bitcells.

In this regard, FIG. 8 illustrates an example of a processor-based system 106 that can employ circuits for voltage or current biasing SRAM bitcells during SRAM reset operations, and the related systems and methods illustrated in FIG. 1. In this example, in the processor-based system 106 includes one or more CPUs 108, each including one or more processors 110. The CPU(s) 108 may have cache memory 112 coupled to the processor(s) 110 for rapid access to temporarily stored data. The SRAM 10 in FIG. 1 may be used as cache memory 112. The CPU(s) 108 is coupled to a system bus 114 and can intercouple master and slave devices included in the processor-based system 106. As is well known, the CPU(s) 108 communicates with these other devices by exchanging address, control, and data information over the system bus 114. For example, the CPU(s) 108 can communicate bus transaction requests to a memory controller 116 as an example of a slave device. Although not illustrated in FIG. 8, multiple system buses 114 could be provided, wherein each system bus 114 constitutes a different fabric.

Other master and slave devices can be connected to the system bus 114. As illustrated in FIG. 8, these devices can include a memory system 118, one or more input devices 120, one or more output devices 122, one or more network interface devices 124, and one or more display controllers 126, as examples. The input device(s) 120 can include any type of input device, including but not limited to input keys, switches, voice processors, etc. The output device(s) 122 can include any type of output device, including but not limited to audio, video, other visual indicators, etc. The network interface device(s) 124 can be any devices configured to allow exchange of data to and from a network 128. The network 128 can be any type of network, including but not limited to a wired or wireless network, a private or public network, a local area network (LAN), a wide local area network (WLAN), and the Internet. The network interface device(s) 124 can be configured to support any type of communication protocol desired. The memory system 118 can include the SRAM 10 of FIG. 1.

The CPU(s) 108 may also be configured to access the display controller(s) 126 over the system bus 114 to control information sent to one or more displays 130. The display controller(s) 126 sends information to the display(s) 130 to be displayed via one or more video processors 132, which process the information to be displayed into a format suitable for the display(s) 130. The display(s) 130 can include any type of display, including but not limited to a cathode ray tube (CRT), a liquid crystal display (LCD), a plasma display, etc.

Those of skill in the art will further appreciate that the various illustrative logical blocks, modules, circuits, and algorithms described in connection with the embodiments disclosed herein may be implemented as electronic hardware, instructions stored in memory or in another computer-readable medium and executed by a processor or other processing device, or combinations of both. The master devices, and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the embodiments disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The embodiments disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary embodiments herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary embodiments may be combined. It is to be understood that the operational steps illustrated in the flow chart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A data entry valid circuit for performing a reset operation on a plurality of static random access memory (SRAM) bitcells in a SRAM, comprising:

a power collapsing circuit configured to collapse power supplied by a power supply to a plurality of SRAM bitcells in a SRAM from an operational power level to a collapsed power level lower than the operational power level in response to receiving a reset input; and a biasing circuit configured to apply a voltage or current bias to the plurality of SRAM bitcells in response to receiving the reset input;

the power collapsing circuit further configured to restore the power supplied by the power supply to the plurality of SRAM bitcells from the collapsed power level to the operational power level while the voltage or current bias is applied by the biasing circuit to the plurality of SRAM bitcells to cause the plurality of SRAM bitcells to reset to a desired state.

2. The data entry valid circuit of claim 1 configured to perform the reset operation on the plurality of SRAM bitcells in the SRAM in a single reset operation by:
the power collapsing circuit being further configured to collapse the power supplied by the power supply to the plurality of SRAM bitcells simultaneously; and
the biasing circuit being further configured to apply the voltage or current bias to the plurality of SRAM bitcells in the data entry valid circuit simultaneously.

3. The data entry valid circuit of claim 1, wherein the plurality of SRAM bitcells in the data entry valid circuit are comprised of SRAM tag array bitcells.

4. The data entry valid circuit of claim 1, wherein the plurality of SRAM bitcells are comprised of an entire column of SRAM bitcells in the SRAM.

5. The data entry valid circuit of claim 1, wherein the plurality of SRAM bitcells are comprised of a plurality of SRAM bitcells in the SRAM.

6. The data entry valid circuit of claim 1, wherein the biasing circuit is provided in a validity bitline driver, the validity bitline driver coupled to each bitline of the plurality of SRAM bitcells to apply write data to each bitline;
wherein the validity bitline driver is further configured to apply the voltage or current bias to each bitline of the plurality of SRAM bitcells in response to receiving the reset input.

7. The data entry valid circuit of claim 6, wherein the validity bitline driver is coupled to each bitline of the plurality of SRAM bitcells in a validity SRAM bitcell column of a tag array in the SRAM to apply the write data to each bitline.

8. The data entry valid circuit of claim 7, further comprising a plurality of bitline drivers coupled to each bitline of the plurality of SRAM bitcells in the SRAM outside the validity SRAM bitcell column to apply the write data to each bitline;
wherein a drive strength of the validity bitline driver is equal to or greater than a drive strength of the plurality of bitline drivers.

9. The data entry valid circuit of claim 1, wherein the power collapsing circuit is further configured to provide the power supplied by the power supply at the operational power level to the plurality of SRAM bitcells to a first power collapsing output and a second power collapsing output coupled to each of the plurality of SRAM bitcells.

10. The data entry valid circuit of claim 9, wherein the biasing circuit is provided in the power collapsing circuit and is configured to collapse the power at the second power collapsing output from the operational power level to the collapsed power level in response to receiving the reset input.

11. The data entry valid circuit of claim 10, wherein the biasing circuit is further configured to apply the voltage or current bias to each of the plurality of SRAM bitcells by delaying the restoring of the power at the second power collapsing output after the power collapsing circuit restores the power at the first power collapsing output from the collapsed power level to the operational power level to cause the plurality of SRAM bitcells to reset in response to receiving the reset input.

12. The data entry valid circuit of claim 1 integrated into an integrated circuit.

13. The data entry valid circuit of claim 1 integrated into a device selected from the group consisting of a set top box, an entertainment unit, a navigation device, a communications device, a fixed location data unit, a mobile location data unit, a mobile phone, a cellular phone, a computer, a portable computer, a desktop computer, a personal digital assistant (pda), a monitor, a computer monitor, a television, a tuner, a radio, a satellite radio, a music player, a digital music player, a portable music player, a digital video player, a video player, a digital video disc (dvd) player, and a portable digital video player.

14. A data entry valid circuit for performing a reset operation on a plurality of static random access memory (SRAM) bitcells in a SRAM, comprising:
a power collapsing circuit means comprising a collapsing means for collapsing power supplied by a power supply means to a plurality of SRAM bitcells in a SRAM means from an operational power level to a collapsed power level lower than the operational power level in response to receiving a reset input; and
a biasing circuit means for applying a voltage or current bias to the plurality of SRAM bitcells in response to receiving the reset input;
the power collapsing circuit means further comprising a restoring means for restoring the power supplied by the power supply means to the plurality of SRAM bitcells from the collapsed power level to the operational power level while the voltage or current bias is applied by the biasing circuit means to the plurality of SRAM bitcells to cause the plurality of SRAM bitcells to reset to a desired state.

15. A method of resetting a plurality of static random access memory (SRAM) bitcells in a SRAM to a desired state, comprising:
receiving a reset input for resetting each of a plurality of SRAM bitcells;
collapsing power supplied by a power supply to the plurality of SRAM bitcells in a SRAM from an operational power level to a collapsed power level lower than the operational power level in response to receiving the reset input;
applying a voltage or current bias to the plurality of SRAM bitcells in response to receiving the reset input; and
restoring the power supplied by the power supply to the plurality of SRAM bitcells from the collapsed power level to the operational power level while the voltage or current bias is applied to the plurality of SRAM bitcells to cause the plurality of SRAM bitcells to reset to a desired state.

16. The method of claim 15, wherein:
collapsing the power supplied by the power supply comprises collapsing the power supplied by the power supply to the plurality of SRAM bitcells in the SRAM from the operational power level to the collapsed power level simultaneously; and
applying the voltage or current bias comprises applying the voltage or current bias to each of the plurality of SRAM bitcells in a data entry valid circuit.

17. The method of claim 15, further comprising receiving the reset input for resetting each of the plurality of SRAM bitcells, wherein the plurality of SRAM bitcells are comprised of SRAM tag array bitcells.

18. The method of claim 15, wherein applying the voltage or current bias to the plurality of SRAM bitcells in response to receiving the reset input further comprises applying the voltage or current bias to the plurality of SRAM bitcells by a biasing circuit, the biasing circuit applying write data to each bitline of the plurality of SRAM bitcells.

19. The method of claim 18, wherein the validity bitline driver applying the write data to each bitline of the plurality of SRAM bitcells comprises the validity bitline driver applying the write data to each bitline of a validity SRAM bitcell column of a tag array.

20. The method of claim 19, further comprising:
applying at least one write data at an at least one first drive strength by at least one bitline driver to at least one SRAM bitcell column outside the validity SRAM bitcell column;
wherein the validity bitline driver applying the write data further comprises the validity bitline driver applying the write data at a second drive strength equal to or greater than the at least one first drive strength to the at least one SRAM bitcell column of the tag array.

21. The method of claim 15, wherein collapsing the power supplied by the power supply to the plurality of SRAM bitcells in the SRAM from the operational power level to the collapsed power level lower than the operational power level in response to receiving the reset input further comprises collapsing the power supplied by the power supply to a first power collapsing output coupled to a first inverter of each of the plurality of SRAM bitcells and a second power collapsing output coupled to a second inverter of each of the plurality of SRAM bitcells.

22. The method of claim 21, wherein:
applying the voltage or current bias to the plurality of SRAM bitcells comprises restoring the power supplied by the power supply to the plurality of SRAM bitcells in the SRAM on the second power collapsing output coupled to the second inverter prior to restoring the power supplied by the power supply to the plurality of SRAM bitcells in the SRAM on the first power collapsing output coupled to the first inverter from the collapsed power level to the operational power level; and
restoring the power supplied by the power supply to the plurality of SRAM bitcells from the collapsed power level to the operational power level comprises restoring the power supplied by the power supply to the plurality of SRAM bitcells from the collapsed power level to the operational power level on the first power collapsing output coupled to the first inverter after restoring the power on the second power collapsing output coupled to the second inverter in response to receiving the reset input.

23. A static random access memory (SRAM) for storing tags in a tag array, comprising:
a data entry valid circuit for performing a reset operation on a plurality of SRAM bitcells in a SRAM, comprising:
a power collapsing circuit configured to collapse power supplied by a power supply to the plurality of SRAM bitcells in the SRAM from an operational power level to a collapsed power level lower than the operational power level in response to receiving a reset input; and
a biasing circuit configured to apply a voltage or current bias to the plurality of SRAM bitcells in response to receiving the reset input;
wherein the power collapsing circuit is further configured to restore the power supplied by the power supply to the plurality of SRAM bitcells from the collapsed power level to the operational power level while the voltage or current bias is applied by the biasing circuit to the plurality of SRAM bitcells to cause the plurality of SRAM bitcells to reset to a desired state;
a tag array comprised of a plurality of SRAM bitcell rows for storing tags, wherein each SRAM bitcell row of the plurality of SRAM bitcell rows comprises the plurality of SRAM bitcells; and
a wordline decoder comprised of a plurality of wordlines coupled to each SRAM bitcell of the plurality of SRAM bitcells in the data entry valid circuit, wherein the wordline decoder is configured to control access to the plurality of SRAM bitcells.

24. The data entry valid circuit of claim 1, wherein the power collapsing circuit is configured to collapse the power supplied by the power supply to the plurality of SRAM bitcells by being configured to collapse the power supply to a first power collapsing output coupled to a first inverter of each of the plurality of SRAM bitcells and a second power collapsing output coupled to a second inverter of each of the plurality of SRAM bitcells.

25. The data entry valid circuit of claim 24, wherein:
the biasing circuit is configured to apply the voltage or current bias to the plurality of SRAM bitcells in response to receiving the reset input by being configured to restore the power supplied by the power supply to the plurality of SRAM bitcells in the SRAM on the second power collapsing output coupled to the second inverter prior to restoring the power supplied by the power supply to the plurality of SRAM bitcells in the SRAM on the first power collapsing output coupled to the first inverter from the collapsed power level to the operational power level; and
the power collapsing circuit is configured to restore the power supplied by the power supply to the plurality of SRAM bitcells from the collapsed power level to the operational power level by being configured to restore the power supplied by the power supply to the plurality of SRAM bitcells from the collapsed power level to the operational power level on the first power collapsing output coupled to the first inverter after restoring the power on the second power collapsing output coupled to the second inverter in response to receiving the reset input.

26. The method of claim 15, further comprising providing the power supplied by the power supply at the operational power level to the plurality of SRAM bitcells to a first power collapsing output and a second power collapsing output each coupled to the plurality of SRAM bitcells.

27. The method of claim 26, wherein collapsing the power supplied by the power supply to the plurality of SRAM bitcells in the SRAM to the collapsed power level lower than the operational power level in response to receiving the reset input comprises collapsing the power at the second power collapsing output from the operational power level to the collapsed power level in response to receiving the reset input.

* * * * *

UNITED STATES PATENT AND TRADEMARK OFFICE
CERTIFICATE OF CORRECTION

PATENT NO. : 9,190,141 B2  
APPLICATION NO. : 14/064297  
DATED : November 17, 2015  
INVENTOR(S) : Chiaming Chai et al.

It is certified that error appears in the above-identified patent and that said Letters Patent is hereby corrected as shown below:

Claims

Column 19, line 1, claim 19, change "biasing circuit, the biasing circuit" to --validity bitline driver--.

Signed and Sealed this  
Twenty-third Day of February, 2016

Michelle K. Lee  
*Director of the United States Patent and Trademark Office*